United States Patent
Nakai (10) Patent No.: US 7,482,878 B2
(45) Date of Patent: Jan. 27, 2009

(54) RADIO FREQUENCY POWER AMPLIFIER CIRCUIT

(75) Inventor: Kazuhito Nakai, Kanagawa (JP)

(73) Assignee: NEC Electronics Corporation, Kawasaki-shi, Kanagawa (JP)

( * ) Notice: Subject to any disclaimer, the term of this patent is extended or adjusted under 35 U.S.C. 154(b) by 84 days.

(21) Appl. No.: 11/541,537

(22) Filed: Oct. 3, 2006

(65) Prior Publication Data

US 2007/0075782 A1    Apr. 5, 2007

(30) Foreign Application Priority Data

Oct. 4, 2005    (JP)    ............................. 2005-291126

(51) Int. Cl.
*H03F 1/52*    (2006.01)
(52) U.S. Cl. .................. 330/298; 330/302; 330/310
(58) Field of Classification Search ................ 330/133, 330/207 P, 298, 302, 310
See application file for complete search history.

(56) References Cited

U.S. PATENT DOCUMENTS

| | | | | |
|---|---|---|---|---|
| 6,580,321 | B1 * | 6/2003 | Arell et al. ................ | 330/207 P |
| 6,850,119 | B2 * | 2/2005 | Arnott ......................... | 330/298 |
| 7,145,397 | B2 * | 12/2006 | Yamamoto et al. .......... | 330/298 |
| 7,330,072 | B2 * | 2/2008 | Brandt ..................... | 330/207 P |

FOREIGN PATENT DOCUMENTS

JP    2003-347857    12/2003

* cited by examiner

*Primary Examiner*—Khanh V Nguyen
(74) *Attorney, Agent, or Firm*—McGinn IP Law Group, PLLC (57) ABSTRACT

A radio frequency power amplifier, having a first amplifying transistor 103-1 and a second amplifying transistor 103-2, comprises a detection circuit 101 that detects an output power and outputs a voltage according to the output power, and a protection transistor 102, controlled by an output of the detection circuit 101, for shunting a current flowing into the base terminal of the first amplifying transistor 103-1. The influence of a circuit for protecting against output load abnormalities on RF characteristics is suppressed.

21 Claims, 6 Drawing Sheets

RADIO FREQUENCY POWER AMPLIFIER CIRCUIT

FIELD OF THE INVENTION

The present invention relates to a radio frequency power amplifier circuit, and particularly to a radio frequency power amplifier suitable for various radio frequency devices such as a mobile phone terminal and a radio frequency power amplifier module using the same.

BACKGROUND OF THE INVENTION

A wireless communication device such as a mobile phone terminal comprises a radio frequency power amplifier for amplifying a modulated signal in its transmission circuit. When the output load of the radio frequency power amplifier fluctuates for some reason and deviates from 50 ohms, its output power increases. In other words, as is well known, the load power is at its maximum when the output impedance of the signal source and the input impedance of the load are matched at 50 ohms. When the input impedance of the load deviates from 50 ohms, the load power decreases and the power consumed by the signal source increases. The increase in output power due to the fluctuation of the output load causes an increase in the collector current and voltage of an amplifying transistor in the output stage of the radio frequency power amplifier, and may result in the destruction of the amplifying transistor in the output stage. As an example of a radio frequency power amplifier having the function of protecting the amplifying transistor from overcurrent and overvoltage in such cases, a structure shown in FIG. 5 is known (refer to FIG. 1 of Patent Document 1).

Figure 5:
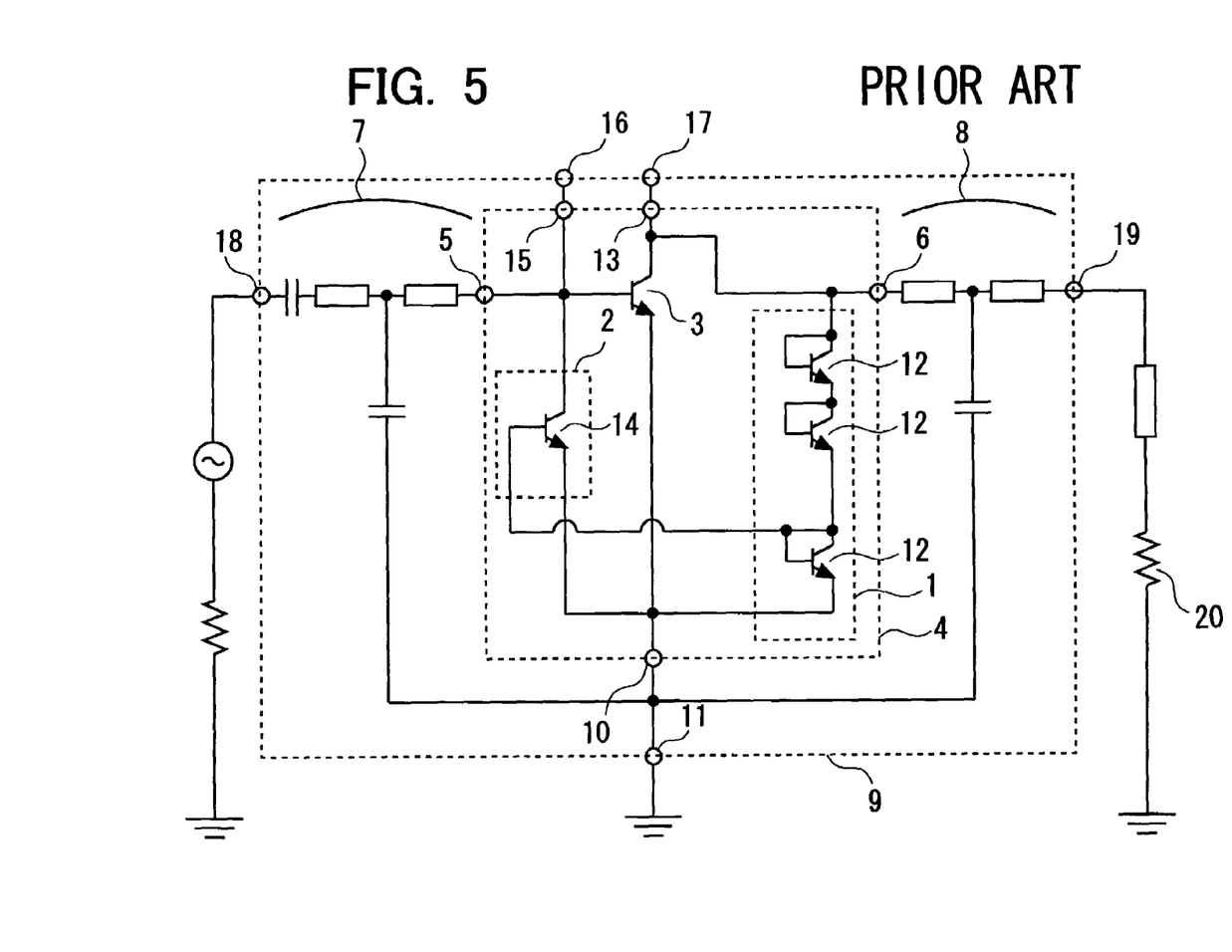
FIG. 5 is an equivalent circuit diagram of a conventional radio frequency power amplifier having a protection circuit.

In FIG. 5, reference symbol 4 indicates the structure of a semiconductor device (IC chip) as a radio frequency power amplifier transistor chip. This IC chip 4 comprises a radio frequency power amplifier transistor 3 (also known as "amplifying transistor") and a protection circuit, and the protection circuit is composed of a voltage detection circuit 1 and a shunt circuit 2. A radio frequency matching circuit 7 for matching input impedance and a radio frequency matching circuit 8 for matching output impedance are provided at an input side terminal 5 and an output side terminal 6 of the IC chip 4, respectively. These are disposed on the same substrate and constitute a radio frequency power amplifier module 9. The emitter of the amplifying transistor 3 is connected to a ground terminal 11 of the module 9 via a ground terminal 10 of the IC chip 4. The voltage detection circuit 1 is constituted by a plurality of vertically (in-series) connected diodes 12 composed of NPN transistors whose bases and collectors are short-circuited, the collector of the uppermost diode 12 is connected to a collector voltage terminal 13 of the amplifying transistor 3, the emitter side of the lowermost diode 12 is grounded via the ground terminal 10 of the IC chip 4, and the short-circuited base and collector of the lowermost diode 12 form an output terminal of the voltage detection circuit 1. The shunt circuit 2 is composed of an NPN transistor (switching transistor) 14 whose collector is connected to a base voltage terminal 15 of the amplifying transistor 3, whose base is connected to the output terminal of the voltage detection circuit 1, and whose emitter is grounded via the ground terminal 10. A base bias terminal 16 and a collector voltage terminal 17 of the radio frequency power amplifier module 9 are connected to the base voltage terminal 15 of the transistor 3 and the collector voltage terminal 13 of the transistor 3, respectively. An input terminal 18 connected to the radio frequency matching circuit 7 for matching input impedance of the radio frequency power amplifier module 9 is provided on the input side, and an output terminal 19 connected to the radio frequency matching circuit 8 for matching output impedance is provided on the output side. An external load 20 of 50 ohms is connected to the output terminal 19.

Figure 6:
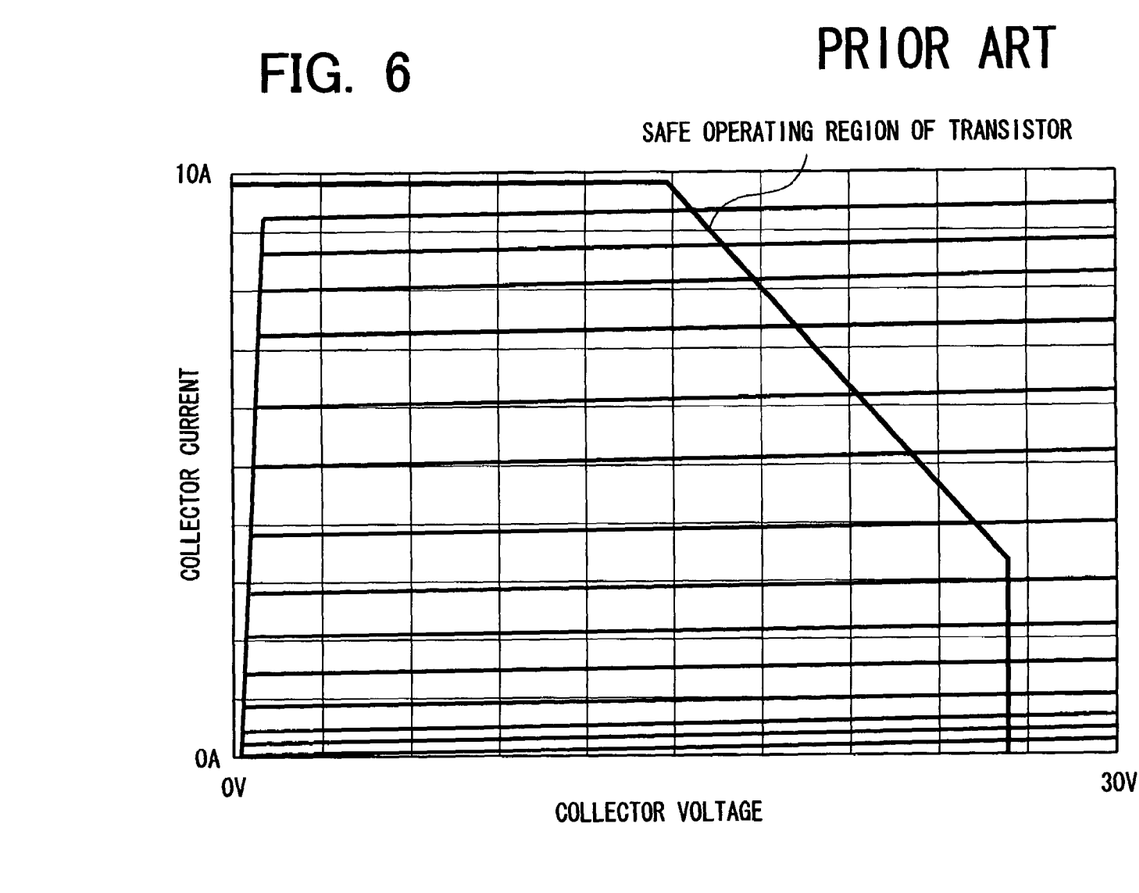
FIG. 6 is a graph showing the relationship between the collector-emitter voltage and the collector current of a transistor and the safe operating region of the transistor against destruction.

FIG. 6 shows the voltage-current characteristics (characteristics when the base current is varied in step) of the amplifying transistor 3 in FIG. 5 (refer to FIG. 5 of Patent Document 1). The abscissa indicates the collector voltage (the collector-emitter voltage) of the amplifying transistor 3 and the ordinate indicates the collector current. In FIG. 6, the area of safe operation (ASO) of the transistor is indicated by a bold line; the collector voltage and collector current should not exceed the area indicated by the bold line. It is desired that a protection function is provided so as to decrease the collector current for protecting the transistor when an overvoltage causing destruction is applied to the collector of the transistor.

In the conventional radio frequency power amplifier shown in FIG. 5, the in-series-connected diodes 12 turn on when an overvoltage is applied to the collector voltage terminal 13 of the amplifying transistor 3, and the NPN transistor 14 turns on. Then the current flowing through the base of the amplifying transistor 3 is shunted to the GND side and the base current of the amplifying transistor 3 decreases, reducing the collector current and protecting the amplifying transistor 3 from being destructed.

[Patent Document 1]

Japanese Patent Kokai Publication No. JP-P2003-347857A

The entire disclosure of the foregoing patent document is incorporated herein by reference thereto.

SUMMARY OF THE DISCLOSURE

However, since the voltage detection circuit 1 and the shunt circuit 2, which form the protection circuit, are connected to the collector voltage terminal 13 and the base voltage terminal 15 of the amplifying transistor 3 in the conventional radio frequency power amplifier described with reference to FIG. 5, the parasitic capacitance component of the protection circuit can be seen from the signal input side. Therefore, even with the standard operation voltage, the protection circuit influences the operation of the radio frequency power amplifier, and this might result in deterioration of RF characteristics.

Further, in the conventional radio frequency power amplifier described with reference to FIG. 5, the amplifying transistor 3 to which the protection circuit is connected is an output stage transistor in the final stage of the radio frequency power amplifier, in which its output load fluctuates according to external factors. Particularly, in systems such as W-CDMA (Wideband Code Division Multiple Access) where the distortion components of output signal waveforms are standardized, the parasitic capacitance component influences the RF characteristics, and this may result in difficulty in meeting the standard.

Further, impedance matching for the final stage of the radio frequency power amplifier greatly influences RF characteristics. Therefore, it is not preferable that the amplifying transistor in the final stage of the radio frequency power amplifier be connected to the protection circuit. Therefore, there is much to be desired in the art.

It is an object of the present invention to solve the above-mentioned problem.

In an aspect of the present invention, a protection circuit is connected to an amplifying transistor in a stage preceding the final stage in a radio frequency power amplifier comprising amplifying transistors in at least two stages, and the influence of the protection circuit on RF characteristics is reduced.

More in detail, according to a first aspect of the present invention a radio frequency power amplifier comprises amplifying transistors in a plurality of stages, a detection circuit that detects an output power, and a protection circuit that controls to shunt a current flowing through a signal input terminal of at least one amplifying transistor disposed in a stage preceding the final stage out of the amplifying transistors in a plurality of stages according to a detector output of the detection circuit.

In a second aspect of the present invention, the protection circuit comprises a switch ON/OFF controlled according to a detector output from the detection circuit, the switch being inserted between a signal input terminal of the amplifying transistor disposed in a stage preceding the final stage and a power supply, and a current flowing through a signal input terminal of the amplifying transistor is shunted to the power supply side when the switch is ON.

In a third aspect of the present invention, it is preferable that the protection circuit be connected to an amplifying transistor in a first stage out of the amplifying transistors in a plurality of stages.

In a fourth aspect of the present invention, it is preferable that the protection circuit comprise a switching transistor whose control terminal is connected to an output of the detection circuit and ON/OFF controlled, the switching transistor being connected between the amplifying transistor in the first stage and a power supply.

In a fifth aspect of the present invention, it is preferable that it comprise a matching circuit connected to an output of the amplifying transistor in the final stage and that the detection circuit detect an output power of the matching circuit and supply a detector output voltage corresponding to the output power to the protection circuit.

Further aspects of the mention will become apparent in the entire disclosure.

The meritorious effects of the present invention are summarized as follows.

According to the present invention, a radio frequency power amplifier can be protected against abnormalities in input power and output load.

According to the present invention, the influence of a protection circuit on RF characteristics is reduced by connecting the protection circuit to an amplifying transistor in the first stage of the radio frequency power amplifier.

According to the present invention, the protection circuit is controlled by using a detection circuit monitoring an output power, and a sufficient margin against destruction due to an increase in the output power can be obtained.

Further, when the present invention is applied to an existing radio frequency power amplifier having a detection circuit, the protection function can be realized solely by adding a protection transistor to the radio frequency power amplifier. Therefore, it is possible to suppress an increase in the cost of the radio frequency power amplifier having protection function.

PREFERRED EMBODIMENTS OF THE INVENTION

Figure 1:
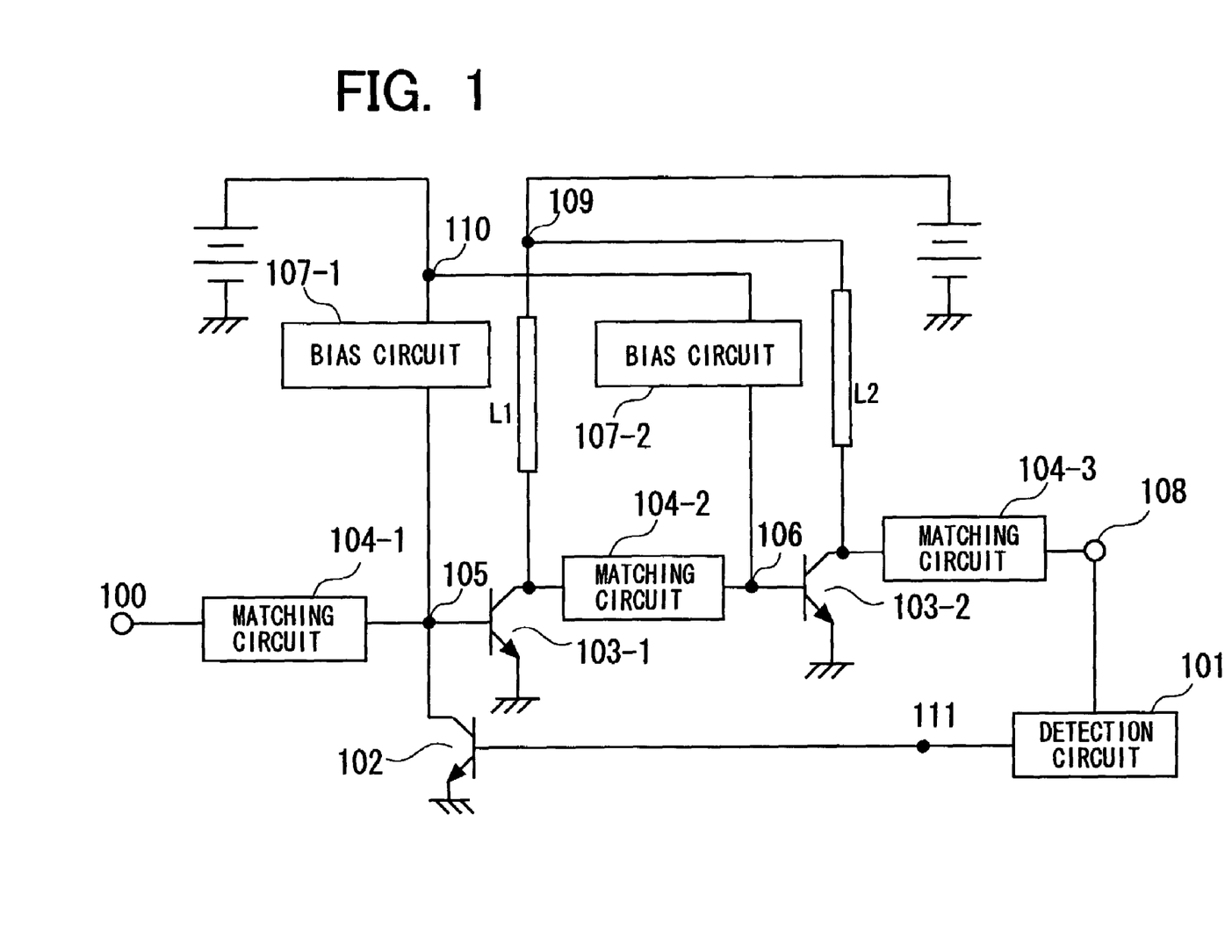
FIG. 1 is a block diagram illustrating the structure of an embodiment of the present invention.

The present invention will be further described in detail with reference to the attached drawings. Referring to FIG. 1, an embodiment of a radio frequency power amplifier relating to the present invention is a radio frequency power amplifier comprising amplifying transistors in a plurality of stages, and it further comprises a detection circuit (101) that detects an output power of the radio frequency power amplifier for outputting a detector output voltage according to the output power, and a protection circuit (102) which is controlled according to an output of the detection circuit (101) and controls to shunt a current flowing into a signal input terminal of an amplifying transistor (103-1) disposed in a stage preceding an amplifying transistor (103-2) in the final stage. According to the present invention, by connecting this protection circuit (102) to the amplifying transistor (103-1) disposed in a stage preceding the final stage, the influence the protection circuit (102) has on RF characteristics is reduced. Hereinafter, the embodiment will be described more in detail.

Embodiment

FIG. 1 is a diagram illustrating the structure of an embodiment of the present invention. A radio frequency power amplifier having amplifying transistors in two stages, as an example, is shown in FIG. 1. Referring to FIG. 1, the present embodiment comprises the amplifying transistors 103-1 and 103-2 whose emitters are grounded and whose collectors are connected to a collector voltage terminal (power supply terminal) 109 via inductances L1 and L2, respectively, an input matching circuit 104-1 connected between an input terminal 100 and a base terminal 105 of the amplifying transistor 103-1, a matching circuit 104-2 connected between the collector of the amplifying transistor 103-1 and a base terminal 106 of the amplifying transistor 103-2, an output matching circuit 104-3 connected between the collector of the amplifying transistor 103-2 and an output terminal 108, bias circuits 107-1 and 107-2, connected to the power supply terminal 110, for applying a driving bias voltage to the base terminals 105 and 106 of the amplifying transistors 103-1 and 103-2, respectively, the detection circuit 101 connected to the output terminal 108, and a switching transistor (also known as "protection transistor") 102 whose emitter is grounded, whose base is connected to the output of the detection circuit 101, and whose collector is connected to the base terminal 105. Note that the structure shown in FIG. 1 has the amplifying transistors 103-1 and 103-2 in two stages, however, the number of stages of the amplifying transistors is not limited to two but may be any plural numbers. Further, the amplifying transistors 103-1 and 103-2 and the protection transistor 102 are constituted by NPN bipolar transistors in FIG. 1, however, the present invention is not limited to such a structure. For instance, PNP transistors may be used, too.

In the present embodiment, the detection circuit 101 connected to the output terminal 108 of the radio frequency power amplifier detects the output power amplified by the radio frequency power amplifier, the voltage outputted from the detection circuit 101 drives the protection transistor 102, and the amplifying transistors 103-1 and 103-2 are protected.

Figure 2:
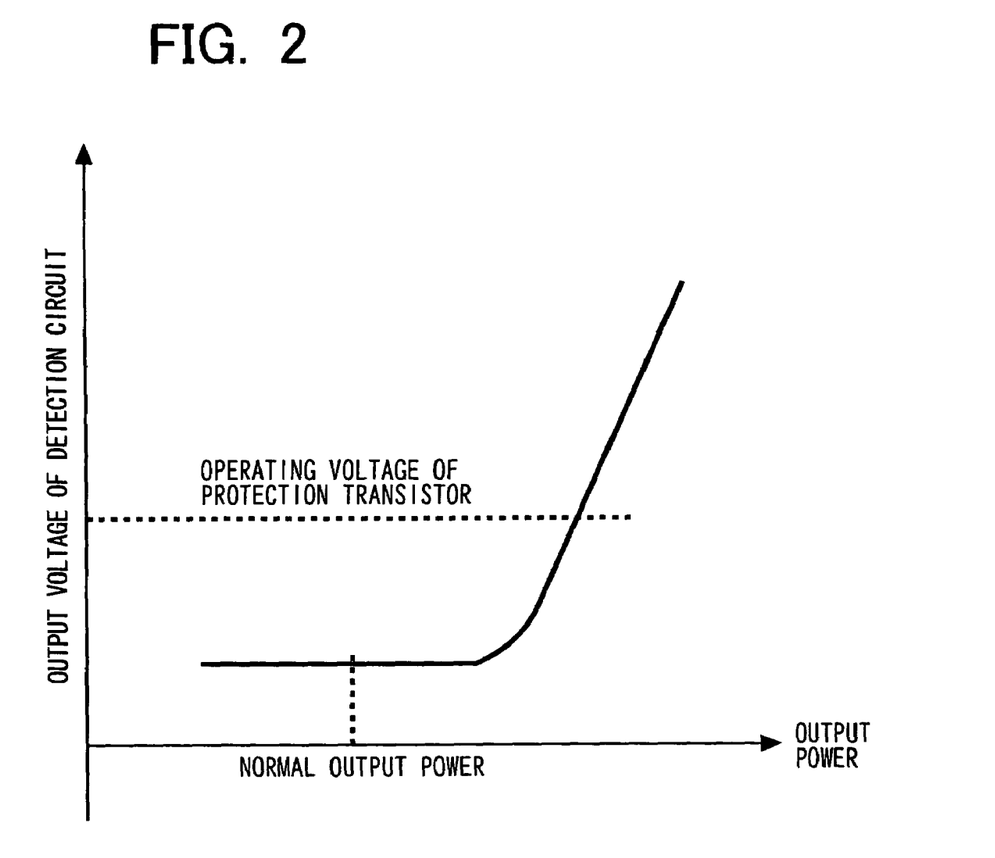
FIG. 2 is a graph showing the relationship between the output voltage of a detection circuit and the output power of a radio frequency power amplifier.

The protection operation of the detection circuit 101 will be described with reference to FIG. 1. When the detection circuit 101 detects power equal to or higher than a predetermined output power value, the output voltage of the detection circuit 101 increases and so does the base-emitter voltage of the protection transistor 102, turning the transistor on. In other words, an output voltage equal to or higher than the operating voltage of the protection transistor shown in FIG. 2 is supplied to the base of the protection transistor 102 by the detection circuit 101. FIG. 2 is a diagram showing the relationship (the solid line) between the output power from the output terminal 108 of the radio frequency power amplifier (the abscissa) and the output voltage of the detection circuit 101 (the ordinate). Further, the operating voltage of the protection transistor indicated by the broken line in FIG. 2 corresponds to the base-emitter voltage that turns on the protection transistor 102.

When the protection transistor 102 turns on, the base current of the amplifying transistor 103-1 in the first stage is shunted to the protection transistor 102 and flows into the GND side. Because of this, the base current of the amplifying transistor 103-1 decreases. The collector current of the amplifying transistor 103-1 also decreases, lowering the degree of power amplification. The power supplied to the amplifying transistor 103-2 is reduced and its base current also decreases. As a result, the collector current of the amplifying transistor 103-2 decreases. By a series of such operations, the amplifying transistor 103-2 is protected.

During normal operation, the detection circuit 101 monitors the output power, and a voltage high enough to turn on the protection transistor 102 is not outputted from the output terminal 111 of the detection circuit 101 at this time. In other words, an output voltage corresponding to the normal output power in FIG. 2 is outputted from the output terminal 111 of the detection circuit 101 during normal operation. Since the level of the output voltage at this time is lower than the operating voltage of the protection transistor shown in FIG. 2, the protection transistor 102 remains in an OFF state.

For instance, when the input power of the radio frequency power amplifier increases for some reason, the output power generated at the output terminal 108 becomes higher and the collector current flowing through the amplifying transistor 103-2 increases since the power supplied to the amplifying transistor 103-2 is high. In such a case, in a radio frequency power amplifier without protection measures unlike the one according to the present invention, the amplifying transistor 103-2 will be destroyed.

Figure 3:
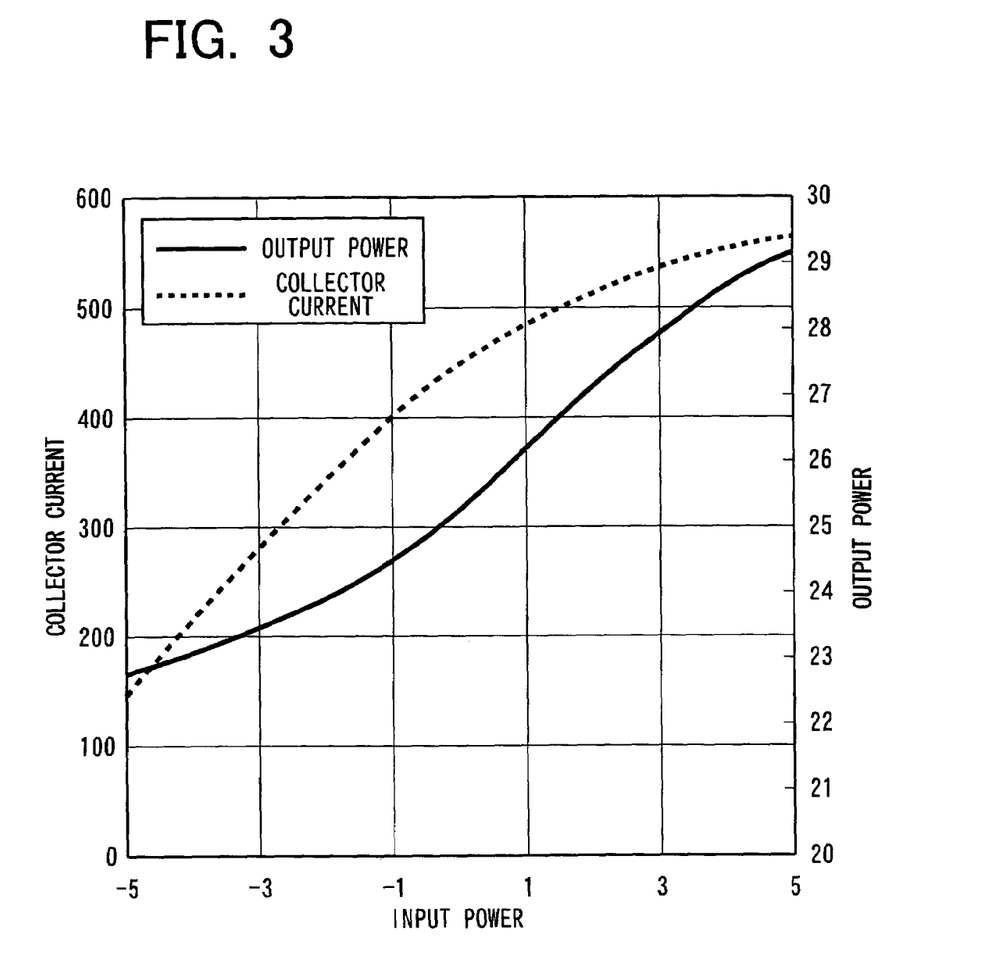
FIG. 3 is a graph showing the relationship between the input power and the output power of a transistor, and the relationship between the input power and the collector current of the transistor.

FIG. 3 is a diagram showing an example of input/output characteristics when a radio frequency signal is supplied to the two-stage radio frequency power amplifier, and the relationship between the input power and the collector current (the broken line) and the relationship between the input power and the output power (the solid line) are shown. In FIG. 3, the unit of the input power along the abscissa is dBm, the unit of the collector current along the left ordinate is mA, and the unit of the output power along the right ordinate is dBm. As shown in FIG. 3, the collector current of the amplifying transistor increases as the input power becomes higher.

In the present embodiment, by turning on the protection transistor 102 when the detection circuit 101 detects excessive output power, it is controlled so that the current supplied to the amplifying transistor 103-2 decreases. As a result, the radio frequency power amplifier can be protected.

Next, what happens when the output load has fluctuated will be described. When the output load fluctuates and deviates from 50 ohms for some reason, the output power increases and so does the collector current of the amplifying transistor 103-2. The detection circuit 101 detects the increase in the output power, and its detector output voltage rises, turning on the protection transistor 102. By the same operating principle described above, the radio frequency power amplifier can be protected when the output load fluctuates.

In the present embodiment, by connecting the protection transistor 102 constituting the protection circuit to the base terminal of the amplifying transistor 103-1 in the first stage of the radio frequency power amplifier, the influence the protection circuit has on the RF characteristics of the radio frequency power amplifier is suppressed and reduced.

Figure 4:
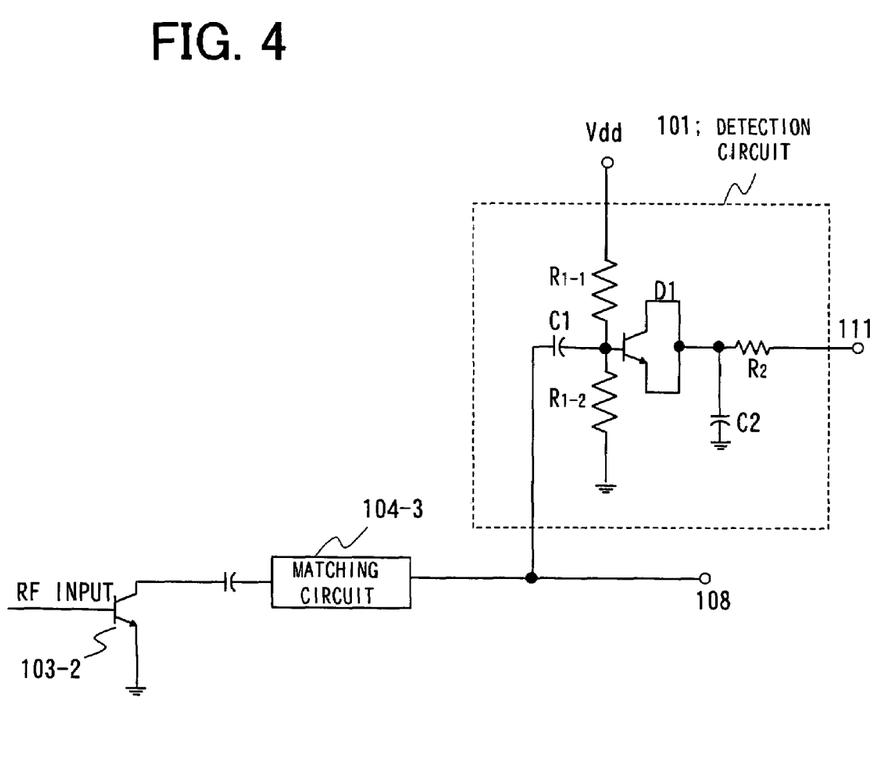
FIG. 4 is a diagram showing an example of the detection circuit of the embodiment of the present invention.

Further, in the present embodiment, any circuit structure such as diode detector circuit can be employed for the detection circuit 101 as long as it outputs a detector output voltage according to the output power of the radio frequency power amplifier. FIG. 4 is a diagram showing a structural example of a diode detector circuit for converting power into a DC voltage proportional to the power, and it comprises a DC cut capacitor C1 whose one end is connected to the output terminal 108 (the output of the matching circuit 104-3) of the radio frequency power amplifier, a rectifying diode D1 whose anode is connected to the other end of the capacitor C1, resistances R1-1 and R1-2 connected between the anode of the diode D1 and the power supply, and the anode of the diode D1 and the ground (GND), respectively, a capacitor C2 connected between the cathode of the diode D1 and GND, and a resistance R2 connected between the cathode of the diode D1 and the detector voltage output terminal 111. The diode D1 is composed of an NPN bipolar transistor whose collector and emitter are connected together. The resistances R1-1 and R1-2 apply a bias voltage such that a forward current does not flow across the diode D1 during the operation under normal power. When the output power of the radio frequency power amplifier increases, the anode voltage of the diode D1 (the base-emitter voltage of the transistor) rises and the forward current flowing through the diode D1 increases. This also increases the terminal voltage of the capacitor C2. In other words, the voltage at the output terminal 111 (the output voltage of the detection circuit) rises with, for instance, the characteristics shown in FIG. 2 corresponding to the increase in the output power.

In the present embodiment, since the detection circuit that detects the output power is used instead of a detection circuit that detects the collector voltage of the amplifying transistor, it is possible to set a sufficient margin against the risk of destroying the amplifying transistors.

Further, according to the present embodiment, a radio frequency power amplifier having a protection circuit relating to the present invention can be realized by simply adding the protection transistor 102 to a radio frequency power amplifier having a detection circuit. Therefore, costs can be reduced. Further, the radio frequency power amplifier shown in FIG. 1 can be integrated into a module on a circuit substrate. The present invention reducing the influence of a protection circuit on RF characteristics is suitable for a radio frequency power amplifier in a transmission circuit of a wireless communication device such as a mobile telephone terminal.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A radio frequency power amplifier for receiving and power-amplifying an input signal for outputting, comprising:
   amplifying transistors in a plurality of stages;
   a detection circuit that detects an output power; and
   a protection circuit that controls to shunt a current flowing through a signal input terminal of at least one amplifying transistor disposed in a stage preceding a final stage out of said amplifying transistors in a plurality of stages according to a detector output of said detection circuit,
   wherein said protection circuit comprises a switch ON/OFF controlled according to a detector output from said detection circuit, and
   wherein a current flowing through a signal input terminal of said at least one amplifying transistor is shunted to a low potential power supply when said switch is ON.

2. The radio frequency power amplifier as defined in claim 1, said switch being inserted between a signal input terminal of said at least one amplifying transistor disposed in the stage preceding said final stage and the low potential power supply.

3. The radio frequency power amplifier as defined in claim 1 wherein said protection circuit is connected to an amplifying transistor in a first stage out of said amplifying transistors in a plurality of stages.

4. The radio frequency power amplifier as defined in claim 3 wherein said protection circuit comprises a switching transistor whose control terminal is connected to an output of said detection circuit and ON/OFF controlled, said switch being connected between a signal input terminal of said amplifying transistor in the first stage and a low potential power supply.

5. The radio frequency power amplifier as defined in claim 1, comprising a matching circuit whose input is connected to a signal output terminal of said amplifying transistor in the final stage, wherein said detection circuit detects an output power of said matching circuit and supplies a detector output voltage corresponding to said output power to said protection circuit.

6. The radio frequency power amplifier as defined in claim 2, comprising a matching circuit whose input is connected to a signal output terminal of said amplifying transistor in the final stage, wherein said detection circuit detects an output power of said matching circuit and supplies a detector output voltage corresponding to said output power to said protection circuit.

7. The radio frequency power amplifier as defined in claim 3, comprising a matching circuit whose input is connected to a signal output terminal of said amplifying transistor in the final stage, wherein said detection circuit detects an output power of said matching circuit and supplies a detector output voltage corresponding to said output power to said protection circuit.

8. The radio frequency power amplifier as defined in claim 5, further comprising a matching circuit between a signal input terminal of at least one amplifying transistor out of said amplifying transistors in a plurality of stages and a signal output terminal of an amplifying transistor in a preceding stage or an input terminal receiving said input signal.

9. The radio frequency power amplifier as defined in claim 6 comprising a matching circuit between a signal input terminal of at least one amplifying transistor out of said amplifying transistors in a plurality of stages and a signal output terminal of an amplifying transistor in a preceding stage or an input terminal receiving said input signal.

10. The radio frequency power amplifier as defined in claim 7 comprising a matching circuit between a signal input terminal of at least one amplifying transistor out of said amplifying transistors in a plurality of stages and a signal output terminal of an amplifying transistor in a preceding stage or an input terminal receiving said input signal.

11. The radio frequency power amplifier as defined in claim 1, further comprising a matching circuit whose input is connected to a signal output terminal of said amplifying transistor in the final stage.

12. The radio frequency power amplifier according to claim 1, wherein the protection circuit is adapted to shunt the current to a ground.

13. A module comprising the radio frequency power amplifier as defined in claim 1.

14. A module comprising the radio frequency power amplifier as defined in claim 2.

15. A module comprising the radio frequency power amplifier as defined in claim 3.

16. A module comprising the radio frequency power amplifier as defined in claim 5.

17. A wireless communication device comprising the radio frequency power amplifier as defined in claim 1 as a power amplifier for power amplifying a transmission signal.

18. A wireless communication device comprising the radio frequency power amplifier as defined in claim 2 as a power amplifier for power amplifying a transmission signal.

19. A wireless communication device comprising the radio frequency power amplifier as defined in claim 3 as a power amplifier for power amplifying a transmission signal.

20. A wireless communication device comprising the radio frequency power amplifier as defined in claim 5 as a power amplifier for power amplifying a transmission signal.

21. A radio frequency power amplifier for receiving and power-amplifying an input signal for outputting, comprising:
   amplifying transistors in a plurality of stages;
   a detection circuit that detects an output power;
   a protection circuit that controls to shunt a current flowing through a signal input terminal of at least one amplifying transistor disposed in a stage preceding a final stage out of said amplifying transistors in a plurality of stages according to a detector output of said detection circuit; and
   a matching circuit between a signal input terminal of at least one amplifying transistor out of said amplifying transistors in a plurality of stages and a signal output terminal of an amplifying transistor in a preceding stage of an input terminal receiving said input signal,
   wherein said protection circuit comprises a switch ON/OFF controlled according to a detector output from said detection circuit.

* * * * *